United States Patent
Galy et al.

(10) Patent No.: US 11,250,309 B2
(45) Date of Patent: Feb. 15, 2022

(54) INTEGRATED ARTIFICIAL NEURON DEVICE

(71) Applicant: STMicroelectronics SA, Montrouge (FR)

(72) Inventors: Philippe Galy, Le Touvet (FR); Thomas Bedecarrats, Saint Martin d'heres (FR)

(73) Assignee: STMicroelectronics SA, Montrouge (FR)

( * ) Notice: Subject to any disclaimer, the term of this patent is extended or adjusted under 35 U.S.C. 154(b) by 1203 days.

(21) Appl. No.: 15/694,510

(22) Filed: Sep. 1, 2017

(65) Prior Publication Data

US 2018/0276526 A1 Sep. 27, 2018

(30) Foreign Application Priority Data

Mar. 23, 2017 (FR) ...................................... 1752383

(51) Int. Cl.
*G06N 3/04* (2006.01)
*G06N 3/063* (2006.01)
(Continued)

(52) U.S. Cl.
CPC .............. *G06N 3/04* (2013.01); *G06N 3/049* (2013.01); *G06N 3/063* (2013.01); *G06N 3/0635* (2013.01); *G11C 11/54* (2013.01); *H01L 27/027* (2013.01); *H01L 27/0285* (2013.01); *H01L 29/42376* (2013.01); *H03K 3/356* (2013.01)

(58) Field of Classification Search
CPC .......... G06N 3/063; G06N 3/04; G06N 3/049; G06N 3/0635
See application file for complete search history.

(56) References Cited

U.S. PATENT DOCUMENTS 8,975,935 B1 3/2015 Yung et al.
2012/0150781 A1 6/2012 Arthur et al.
(Continued)

FOREIGN PATENT DOCUMENTS

CN 101710700 A 5/2010
CN 105741741 A 7/2016
(Continued)

OTHER PUBLICATIONS

Indiveri, Giacomo, et al. "Neuromorphic silicon neuron circuits." Frontiers in neuroscience 5 (2011): 73. (Year: 2011).*
(Continued)

*Primary Examiner* — Benjamin P Geib
(74) *Attorney, Agent, or Firm* — Crowe & Dunlevy

(57) ABSTRACT

An integrated artificial neuron device includes an input signal node, an output signal node and a reference supply node. An integrator circuit receives and integrates an input signal to produce an integrated signal. A generator circuit receives the integrated signal and, when the integrated signal exceeds a threshold, delivers the output signal. The integrator circuit includes a main capacitor coupled between the input signal node and the reference supply node. The generator circuit includes a main MOS transistor coupled between the input signal node and the output signal node. The main MOS transistor has a gate that is coupled to the output signal node, and a substrate that is mutually coupled to the gate.

24 Claims, 3 Drawing Sheets

(51) Int. Cl.
  *H01L 27/02*   (2006.01)
  *G11C 11/54*   (2006.01)
  *H01L 29/423*  (2006.01)
  *H03K 3/356*   (2006.01)

(56) References Cited

U.S. PATENT DOCUMENTS

2015/0006455 A1* 1/2015 Suri ............... G11C 13/0002
                                              706/32
2019/0130258 A1* 5/2019 Cappy ............. G06N 3/049

FOREIGN PATENT DOCUMENTS

CN    207302125 U   5/2018
FR      3038131 A1  12/2016

OTHER PUBLICATIONS

INPI Search Report and Written Opinion for FR Appl. No. 1752383 dated Feb. 22, 2018 (10 pages).

Dray, A. et al: "ESD Design Challenges in 28nm Hybrid FDSOI / Bulk Advanced CMOS Process," Proceedings of the 34th Electrical Overstress/Electrostatic Discharge Symposium (EOS/ESD'12), Sep. 9, 2012 (8 pages).

Cardarilli, G., et al: "Implementazione Hardware Di Reti Neurali Spiking Bio-Realistiche, Basate Su Memristore," Memorie Della XXXII Riunione Annuale Dei Ricercatori Di Elettrotecnica Jun. 15, 2016 (2 pages).

Acciarito, S., et al: "Hardware Design of LIF With Latency Neuron Model With Memristive STDP Synapses," Integration the VLSI Journal, vol. 59, May 25, 2017 (pp. 81-89).

Acciarito, S., et al: "Hardware Implementation of a Spiking Neuron Model Based on Memristor," Technical Program of the 48th Annual Meeting of the Associazione Gruppo Italiano Di Elettronica, Jun. 22-24, 2016 (36 pages).

Indiveri: "A low-power adaptive integrate-and-fire neuron circuit," Proceedings of the 20034 International Symposium on Circuits and Systems, 2003, ISCAS'03, vol. 4, IEEE, 2003, 4 pages.

Aamir, Syed Ahmed, et al: "A Highly Tunable 65-nm CMOS LIF Neuron for a Large Scale Neuromorphic System," IEEE 2016, pp. 63-66.

Folowosele, Fopefolu, et al: "A Switched Capacitor Implementation of the Generalized Linear Integrated-And-Fire Neuron," 2009 IEEE International Symposium on Circuits and Systems, pp. 2149-2152.

Fujii, R. H., et al: "Spiking Analog Neuron Circuit Design, Analysis, and Simulation," Proceedings of the 44th IEEE 2001 Midwest Symposium on Circuits and System, pp. 482-486.

Sarpeshkar, Rahul, et al: "Refractory Neuron Circuits," CNS Technical Report, No. CNS-TR-92-08, California Institute of Technology, Pasadena, CA, 1992, pp. 1-29.

Xinyu Wu, et al., "A CMOS spiking neuron for dense memristor-synapse connectivity for brain-inspired computing," 2015 International Joint Conference on Neural Networks (IJCNN), Killarney, 2015, pp. 1-6.

First Office Action and Search Report for co-pending CN Appl. No. 201710773215.0 dated May 6, 2021 (10 pages).

\* cited by examiner

INTEGRATED ARTIFICIAL NEURON DEVICE

PRIORITY CLAIM

This application claims the priority benefit of French Application for Patent No. 1752383, filed on Mar. 23, 2017, the disclosure of which is hereby incorporated by reference in its entirety to the maximum extent allowable by law.

TECHNICAL FIELD

Embodiments relate to artificial intelligence and, in particular, to the creation of networks of neurons in the context of what is known to those skilled in the art as 'deep learning'. More particularly, embodiments relate to integrated electronic circuits that simulate the behavior of neurons.

BACKGROUND

A biological neuron comprises a plurality of parts, including: one or more dendrites that deliver(s) an electrical input signal; the body of the neuron or soma which accumulates the input signal in the form of a potential difference between the interior and the exterior of its membrane; and an axon configured to deliver an output signal or action potential when the voltage between the exterior and the interior of the membrane reaches a certain threshold. In a biological neuron, electrical leakages occur through the membrane if electrical equilibrium is not achieved between the interior and the exterior of the membrane.

An artificial neuron should mimic the biological neuron and thus be capable of receiving an input signal, integrating the input signal and, when the integrated signal reaches a threshold, emitting an output signal in the form of one or more voltage spikes.

In the field of networks of artificial neurons, the acronym LIF ('Leaky Integrate-and-Fire') denotes a simple behavioral model of the artificial neuron, in which the artificial neuron receives and accumulates an input signal until a threshold value is exceeded, beyond which threshold value the neuron emits an output signal.

This model takes into account, in particular, the electrical leakages of the neuron through the membrane of the neuron.

The neuron may either receive a series of successive current spikes until an output current spike is generated, or receive a continuous signal at the input and generate a train of current spikes at the output.

Solutions exist for the creation of artificial neurons in accordance with the LIF model including, for example, the use of several tens of transistors and at least one capacitor of large size, typically one hundred square micrometers.

Because of the large size of the capacitor, the reaction time of this type of circuit is of the order of one millisecond.

Moreover, applications in the field of artificial intelligence, such as, for example but without limitation, the simulation of brain activity, require the creation of networks including a very large number of artificial neurons, typically of the order of one billion. It would thus be very advantageous to use integrated circuits of reduced size.

Solutions exist that use neurons of more reduced sizes and that make it possible to achieve higher operating speeds, but these solutions require the implementation of specific manufacturing methods.

SUMMARY

Thus, according to one embodiment, there is proposed an artificial neuron of reduced size which enables a high information processing speed and that can be advantageously produced using conventional CMOS manufacturing methods.

According to one aspect, an integrated artificial neuron device, includes: an input node configured to receive at least one input signal, an output node configured to deliver at least one output signal, a reference node configured to deliver at least one reference signal, an integrator circuit configured to receive and integrate said at least one input signal and deliver an integrated signal, a generator circuit configured to receive the integrated signal and, when the integrated signal exceeds a threshold, deliver the output signal.

In this device, the integrator circuit includes a main capacitor coupled between the input node and the reference node, the generator circuit includes a main MOS transistor having a first electrode that is coupled to the input node, a second electrode that is coupled to the output node, and a gate that is coupled to the output node. The main transistor further has its substrate ('body' in the case of technologies of silicon-on-insulator type, 'bulk' in the case of technologies of bulk substrate type) and its gate mutually coupled together.

The artificial neuron device thus includes few components, which advantageously enables a large reduction of the surface area of the device, and therefore a high rate of integration, with respect to existing devices.

The mutual coupling between the substrate and the gate of the main MOS transistor (for example, by a direct electrical connection) advantageously enables the device to operate with low current and voltage values.

Moreover, the use of conventional components makes it possible to produce the device in accordance with conventional CMOS methods.

The generator circuit may include a control circuit coupled between the substrate of the main MOS transistor and the reference node and configured to adjust the value of said threshold.

The control circuit may, for example, include a control resistor.

As a variant, the control circuit may include a control transistor having the control electrode configured to receive a control signal so as to modify its resistance in the ON state, the value of said threshold depending on the value of said control signal.

The main MOS transistor may have a gate width of one micrometer and a gate length of one hundred nanometers.

As a variant, the main MOS transistor may have a gate width smaller than two hundred nanometers and a gate length smaller than twenty-eight nanometers.

The main capacitor may have a surface area smaller than 0.5 micrometers.

By using components of reduced sizes, it is thus possible to obtain a small overall device surface area, and therefore a low power consumed by the device and a high operating frequency.

According to one embodiment, the device may further include a supply node configured to receive a supply voltage and a refractory circuit configured to inhibit the integrator circuit for an inhibition duration after said delivery of said at least one output signal by the generator circuit, the refractory circuit including a first secondary MOS transistor having a first electrode that is coupled to the input node, a second electrode that is coupled to the reference node, and a gate that is connected to said output node by a second secondary MOS transistor having a first electrode that is coupled to said supply node, a second electrode that is coupled to the gate of the first secondary MOS transistor, and a gate that is coupled to the output node. The refractory circuit further includes a resistive-capacitive circuit coupled between the supply node, the reference node and the gate of the second secondary MOS transistor. The inhibition duration depends on a time constant of said resistive-capacitive circuit.

The resistive-capacitive circuit may include a secondary capacitor having a first electrode that is coupled between said supply node and the gate of the first secondary MOS transistor, and a secondary resistor coupled between the gate of the second secondary MOS transistor and the reference node.

The neuron device including the refractory circuit therefore has a behavior even closer to that of a biological neuron.

Furthermore, the use of a reduced number of components makes possible a reduced surface area of the refractory circuit.

According to another aspect, an integrated circuit comprises a network of artificial neurons including a plurality of devices such as those described previously.

BRIEF DESCRIPTION OF THE DRAWINGS

Other advantages and features of the invention will become apparent upon examining the detailed description of completely non-limiting embodiments of the invention and the appended drawings, in which.

DETAILED DESCRIPTION

Figure 1:
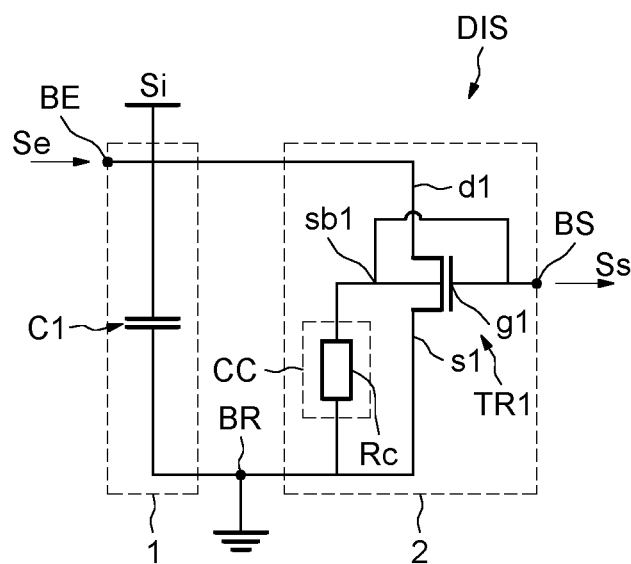
FIG. 1 schematically illustrates from an electrical point of view an integrated artificial neuron device.

FIG. 1 illustrates, schematically and from an electrical point of view, an integrated artificial neuron device DIS, produced in and on a semiconductor substrate that may be either a bulk substrate or a substrate of silicon-on-insulator type and configured in particular to implement the LIF neuron model.

The operation of the neuron device DIS in this case is therefore analogous to that of a biological neuron.

The device DIS includes an input node BE configured to receive an input signal Se, an output node BS configured to deliver an output signal Ss, and a reference node BR configured to receive a reference voltage, in this case ground for example.

The input signal may come from a single source or else be the combination of a plurality of different signals originating from different sources at the node BE.

The device also includes an integrator circuit 1, configured to receive and integrate the input signal Se and to deliver an integrated input signal Si, and a generator circuit 2, configured to deliver the output signal Ss when the integrated signal reaches a threshold (or 'triggering threshold').

The integrator circuit 1 in this case includes a main capacitor C1 coupled between the input node BE and the reference node BR.

The main capacitor in this case is an MOS capacitor having a surface area of one square micrometer.

The generator circuit 2 includes a main MOS transistor TR1 having a first electrode, in this case its drain d1, that is coupled to the input node BE, a second electrode, in this case its source s1, that is coupled to the reference node BR, and a gate g1 that is coupled to the output node BS.

The substrate sb1 of the main MOS transistor is coupled electrically to the gate g1 (in an embodiment, using a direct electrical connection).

The main MOS transistor TR1 includes a parasitic bipolar transistor where the base is the substrate of the MOS transistor, the collector is the drain d1 and the emitter is the source s1.

In this case, the main MOS transistor has a gate width of one micrometer and a gate length (distance between drain and source) of one hundred nanometers.

A control circuit CC is coupled between the substrate sb1 and the reference node BR and is configured to adjust a value of the triggering threshold of the generator circuit 2.

In this case, the control circuit includes a control resistor Rc having a resistance value of one gigaohm in this example.

Thus, in the presence of an input signal Se on the input node, the main capacitor C1 charges, and the value of the voltage across its nodes (the integrated signal) increases.

When the integrated signal Si, that is to say the voltage across the nodes of the capacitor C1 and of the first transistor TR1, reaches said triggering threshold, then the integrated signal Si is transmitted by means of the drain-substrate capacitance of the first transistor TR1 and the leakage currents of the drain-substrate junction on the substrate sb1 of the first transistor TR1, and by the drain-gate capacitance on the gate g1 of the first transistor TR1. The presence of the drain-substrate capacitance of the transistor TR1, which is very large with respect to the drain-gate capacitance of the transistor TR1, as well as the connection between the substrate and the gate of the transistor TR1, makes it possible to obtain operation of the MOS transistor in sub-threshold mode, combined with intrinsic operation of the bipolar transistor.

Furthermore, these combined effects amplify one another mutually. Specifically, since the drain-substrate capacitance is very large with respect to the drain-gate capacitance, the pulse transmitted on the gate is weaker than that transmitted on the substrate. The connection between the gate g1 and the substrate sb1 enables the gate to bias to a greater extent (by way of the drain-gate capacitance but also by way of the bias of the substrate sb1) and, as a result, to amplify these combined effects, since the closer the gate voltage gets to the threshold voltage of the MOS transistor, the more the current gain of the parasitic bipolar transistor increases.

Moreover, the higher the product of the resistance of the control resistor Rc and the capacitance of the drain-substrate capacitance, the lower the value of the triggering threshold.

This type of integrator circuit is particularly advantageous as it makes it possible to obtain a low triggering threshold, for example of the order of one volt.

Figure 2:
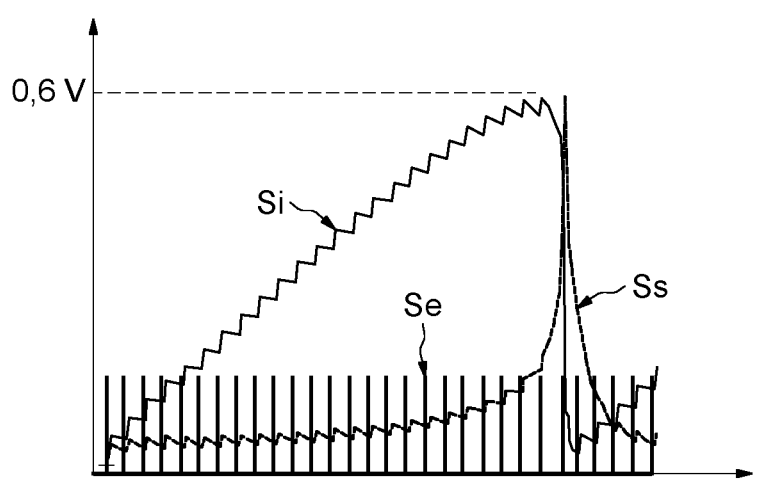
FIGS. 2 and 3 show the progression of an input signal Se, an integrated signal and an output signal during operation of the artificial neuron device of FIG. 1.
Figure 3:
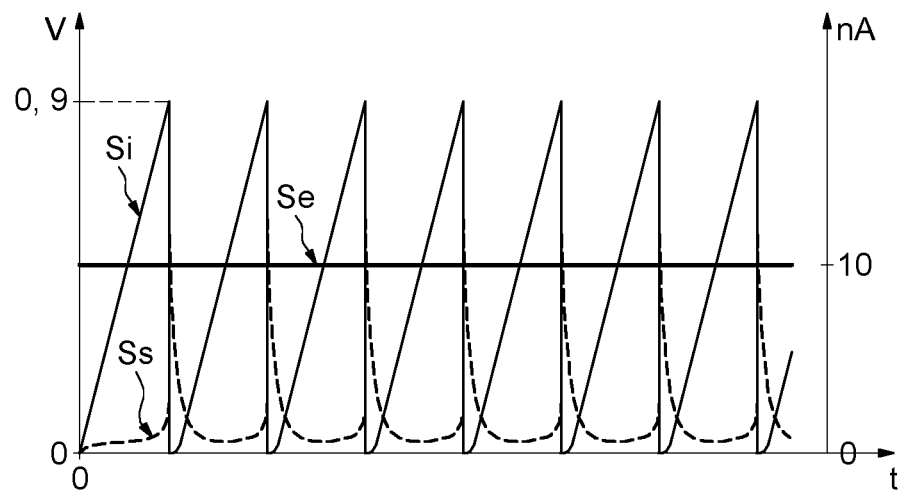

FIGS. 2 and 3 show the progression of the input signal Se, the integrated signal Si and the output signal Ss during operation of the artificial neuron device DIS.

In a first example illustrated by FIG. 2, the input node BE in this case receives a series of current spikes, having a constant or non-constant amplitude, in a regular or irregular manner, and that form the input signal Se.

The integrated signal Si, which corresponds to the voltage across the nodes of the capacitor, increases gradually and incrementally at each current spike.

When the integrated signal Si reaches the triggering threshold of the integrator circuit 2, 0.6 volts in this case, the main MOS transistor TR1 triggers, the capacitor C1 discharges through the MOS transistor TR1 and the gate is biased for a very brief duration. The bias spike of the gate in this case forms the output signal Ss.

Between each current spike of the input signal Se, the value of the voltage across the nodes of the capacitor drops slightly. This is due in particular to the leakage current of the main transistor TR1, which therefore simulates the electrical leakages through the membrane of the biological neuron.

In this first example, the input signal has a frequency of 1 megahertz and an amplitude of one hundred nanoamperes, with spikes of a duration of 20 nanoseconds, and the output signal has spikes of 753 nanoseconds at a frequency of 39 kilohertz.

In a second example illustrated by FIG. 3, the input node BE receives a direct current having a value of ten nanoamperes.

The integrated signal Si increases continuously until reaching the triggering threshold of the integrator circuit 2, 0.9 volts in this case. The main MOS transistor TR1 then triggers, and the capacitor C1 discharges through the MOS transistor TR1 and the gate is biased for a very brief duration.

In this second example, the duration to reach the threshold is much shorter than in the first example, and the frequency of the output signal is 1.11 megahertz.

The use of components of reduced size thus readily permits the use of high frequencies and a low electrical consumption.

The frequency and the amplitude of the output signal depend on several parameters, in particular on the doping and on the surface area of the main capacitor C1, which is an MOS capacitor, on the doping and on the dimensions of the main transistor, and on the value of the control resistor Rc.

A person skilled in the art will know to adjust these values depending on the envisaged applications.

Figure 4:
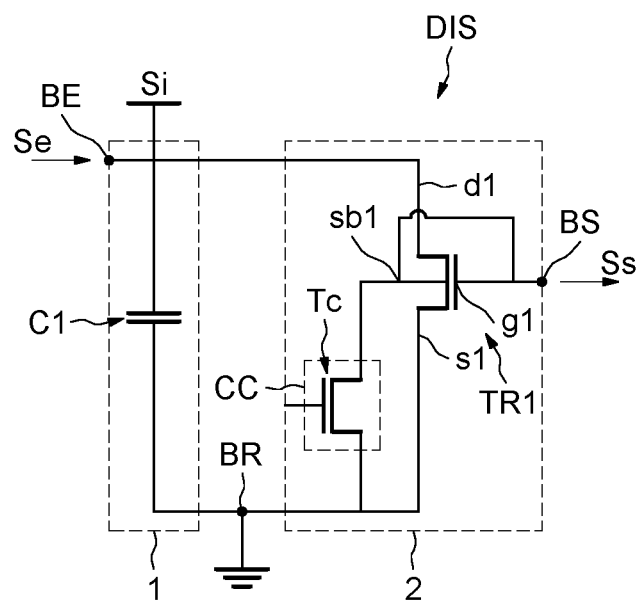
FIG. 4 schematically illustrates from an electrical point of view an integrated artificial neuron device.

According to one embodiment illustrated in FIG. 4, it is also possible that the control circuit CC includes a control transistor Tc having a first electrode that is coupled to the substrate of the first MOS transistor, a second electrode that is coupled to the reference node, and a gate that is configured to receive a control signal.

Depending on the value of the control signal, the resistance of the control transistor Tc in the ON state varies, thus adjusting the value of the triggering threshold of the main transistor TR1 and therefore of the generator circuit 2.

The control signal may, for example, be delivered by an adjunct module of the neuron device DIS, for example depending on the characteristics of the input signal, this in order to get still closer to the adaptable nature of biological neurons.

Figure 5:
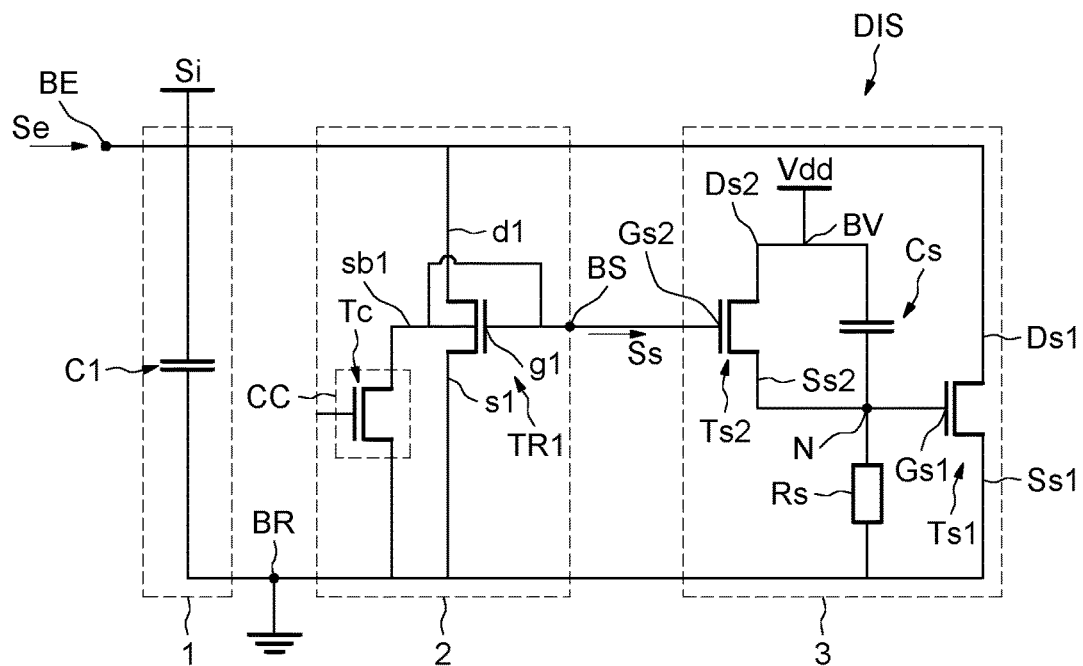
FIG. 5 schematically illustrates from an electrical point of view an integrated artificial neuron device with a refractory circuit.

According to one embodiment illustrated in FIG. 5, the neuron device DIS includes a refractory circuit 3 that is configured to inhibit the integrator circuit 1 for an inhibition period. A supply node BV is configured to receive a supply voltage Vdd, for example a voltage of one volt in this case.

Specifically, it has been observed that biological neurons are inhibited for a period following the delivery of an action potential by the axon of the neuron.

The aim of this refractory circuit 3 is therefore to bring the operation of the neuron device DIS even closer still to the operation of a biological neuron.

The refractory circuit 3 includes a first secondary transistor Ts1 having a first electrode, in this case the drain Ds1, that is coupled to the input node, and a second electrode, in this case the source Ss1, that is coupled to the reference node.

The gate Gs1 of the first secondary transistor Ts1 is coupled to a common node N.

A second secondary transistor Ts2 has a gate coupled to the output node BS, a first electrode, in this case the drain Ds2, that is coupled to the supply node BV, and a second electrode, in this case the source Ss2, that is coupled to the common node N.

A secondary capacitor Cs is coupled between the supply node BV and the common node N. The secondary capacitor Cs is in this case an MOS capacitor having, for example, a surface area of one square micrometer.

A secondary resistor Rs, for example in this case a resistor of one gigaohm that can be created in practice by an MOS transistor in the ON state, is coupled between the common node N and the reference node BR.

Thus, in operation, before the appearance of a voltage spike on the output node, the secondary capacitor Cs is charged and the voltage across its nodes is equal to the voltage Vdd.

The potential of the common node N is therefore zero, and the gate of the first secondary transistor Ts1 is not biased.

In the presence of a current spike on the output node, the gate Gs2 of the second secondary transistor biases and the second secondary transistor Ts2 becomes conductive.

The gate of the first secondary transistor Ts1 is therefore biased at the voltage Vdd by means of the second secondary transistor Ts2, and the first secondary transistor Ts1 therefore becomes conductive, thus short-circuiting the secondary capacitor Cs.

The potential of the common node N, and therefore the gate Gs1 of the first secondary transistor Ts1, is biased at the supply voltage Vdd, and the first secondary transistor Ts1 becomes conductive, thus short-circuiting the main capacitor.

Once the current spike on the output node has passed, the second secondary transistor Ts2 open circuits again, the voltage across the nodes of the secondary capacitor Cs increases progressively, and the potential of the common node therefore decreases progressively until reaching a zero value when the secondary capacitor is completely charged.

When the potential of the common node reaches a value lower than the triggering threshold of the first secondary transistor, the first secondary transistor close circuits again.

The inhibition of the integrator circuit by the refractory circuit thus takes place for an inhibition duration that depends on the charging speed of the secondary capacitor Cs through the secondary resistor Rs.

The inhibition duration therefore depends on the time constant of the resistive-capacitive circuit including the secondary resistor Rs and the secondary capacitor Cs.

The structure of such a refractory circuit is advantageous with respect to the refractory circuits of the prior art in that it has a reduced number of components, and as a result makes it possible to obtain a refractory circuit of which the surface area is less than two square micrometers.

Figure 6:
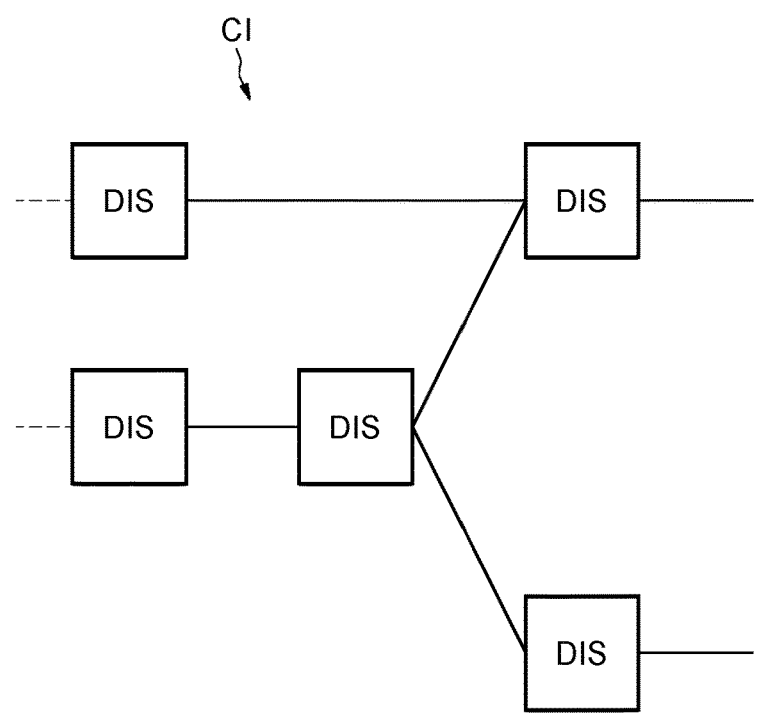
FIG. 6 illustrates a network of artificial neurons.

According to one embodiment illustrated in FIG. 6, it would be possible to have an integrated circuit CI including a network of artificial neurons, including a plurality of neuron devices according to one or more of the embodi-

The invention claimed is:

1. An integrated artificial neuron device, comprising:
   an input node configured to receive at least one input signal,
   an output node configured to deliver at least one output signal,
   a reference node configured to receive a reference voltage,
   an integrator circuit configured to receive and integrate said at least one input signal and deliver an integrated signal,
   a generator circuit configured to receive the integrated signal and, when the integrated signal exceeds a threshold, deliver the output signal,
   wherein the integrator circuit includes a main capacitor coupled between the input node and the reference node,
   wherein the generator circuit includes a main MOS transistor having a first electrode that is coupled to the input node, a second electrode that is coupled to the reference node, and a gate that is coupled to the output node, said main MOS transistor further having a substrate and the gate mutually coupled together.

2. The integrated artificial neuron device according to claim 1, wherein the generator circuit includes a control circuit coupled between the substrate of the main MOS transistor and the reference node and configured to adjust a value of said threshold.

3. The integrated artificial neuron device according to claim 2, wherein the control circuit includes a control resistor.

4. The integrated artificial neuron device according to claim 2, wherein the control circuit includes a control transistor having a control electrode that is configured to receive a control signal which modifies an on resistance of the control transistor, the value of said threshold depending on a value of said control signal.

5. The integrated artificial neuron device according to claim 1, wherein the main MOS transistor has a gate width of one micrometer and a gate length of one hundred nanometers.

6. The integrated artificial neuron device according to claim 1, wherein the main MOS transistor has a gate width smaller than two hundred nanometers and a gate length smaller than twenty-eight nanometers.

7. The integrated artificial neuron device according to claim 1, wherein the main capacitor has a surface area smaller than one square micrometer.

8. The integrated artificial neuron device according to claim 1, further comprising:
   a supply node configured to receive a supply voltage; and
   a refractory circuit configured to inhibit the integrator circuit for an inhibition duration after said delivery of said at least one output signal by the generator circuit.

9. The integrated artificial neuron device according to claim 8, wherein the refractory circuit comprises:
   a first secondary MOS transistor having a first electrode that is coupled to the input node, a second electrode that is coupled to the reference node, and a gate that is connected to said output node by a second secondary MOS transistor having a first electrode that is coupled to said supply node, a second electrode that is coupled to the gate of the first secondary MOS transistor, and a gate that is coupled to the reference node,
   wherein the refractory circuit further includes a resistive-capacitive circuit coupled between the supply node, the reference node and the gate of the second secondary MOS transistor, said inhibition duration depending on a time constant of said resistive-capacitive circuit.

10. The integrated artificial neuron device according to claim 9, wherein the resistive-capacitive circuit includes a secondary capacitor having a first electrode that is coupled between said supply node and the gate of the first secondary MOS transistor, and a secondary resistor that is coupled between the gate of the second secondary MOS transistor and the reference node.

11. The integrated artificial neuron device according to claim 1, wherein the first electrode of the main MOS transistor is directly electrically connected to the input node, the gate of the main MOS transistor is directly electrically connected to the output node, and the gate of the main MOS transistor is also directly electrically connected to the substrate of the main MOS transistor.

12. The integrated artificial neuron device according to claim 1, wherein the main MOS transistor is an NMOS transistor having a drain coupled to the input node, a source coupled to the reference node, and a gate coupled to the output node.

13. An integrated circuit comprising a network of connected artificial neuron devices, wherein each artificial neuron device comprises:
   an input node configured to receive at least one input signal,
   an output node configured to deliver at least one output signal,
   a reference node configured to receive a reference voltage,
   an integrator circuit configured to receive and integrate said at least one input signal and deliver an integrated signal,
   a generator circuit configured to receive the integrated signal and, when the integrated signal exceeds a threshold, deliver the output signal,
   wherein the integrator circuit includes a main capacitor coupled between the input node and the reference node,
   wherein the generator circuit includes a main MOS transistor having a first electrode that is coupled to the input node, a second electrode that is coupled to the reference node, and a gate that is coupled to the output node, said main MOS transistor further having a substrate and the gate mutually coupled together.

14. The integrated circuit according to claim 13, wherein the generator circuit includes a control circuit coupled between the substrate of the main MOS transistor and the reference node and configured to adjust a value of said threshold.

15. The integrated circuit according to claim 14, wherein the control circuit includes a control resistor.

16. The integrated circuit according to claim 14, wherein the control circuit includes a control transistor having a control electrode that is configured to receive a control signal which modifies an on resistance of the control transistor, the value of said threshold depending on a value of said control signal.

17. The integrated circuit according to claim 13, wherein the main MOS transistor has a gate width of one micrometer and a gate length of one hundred nanometers.

18. The integrated circuit according to claim 13, wherein the main MOS transistor has a gate width smaller than two hundred nanometers and a gate length smaller than twenty-eight nanometers.

19. The integrated circuit according to claim 13, wherein the main capacitor has a surface area smaller than one square micrometer.

20. The integrated circuit according to claim 13, further comprising:
- a supply node configured to receive a supply voltage; and
- a refractory circuit configured to inhibit the integrator circuit for an inhibition duration after said delivery of said at least one output signal by the generator circuit.

21. The integrated circuit according to claim 20, wherein the refractory circuit comprises:
- a first secondary MOS transistor having a first electrode that is coupled to the input node, a second electrode that is coupled to the reference node, and a gate that is connected to said output node by a second secondary MOS transistor having a first electrode that is coupled to said supply node, a second electrode that is coupled to the gate of the first secondary MOS transistor, and a gate that is coupled to the output node,
- wherein the refractory circuit further includes a resistive-capacitive circuit coupled between the supply node, the reference node and the gate of the second secondary MOS transistor, said inhibition duration depending on a time constant of said resistive-capacitive circuit.

22. The integrated circuit according to claim 21, wherein the resistive-capacitive circuit includes a secondary capacitor having a first electrode that is coupled between said supply node and the gate of the first secondary MOS transistor, and a secondary resistor that is coupled between the gate of the second secondary MOS transistor and the reference node.

23. The integrated circuit according to claim 13, wherein the first electrode of the main MOS transistor is directly electrically connected to the input node, the gate of the main MOS transistor is directly electrically connected to the output node, and the gate of the main MOS transistor is also directly electrically connected to the substrate of the main MOS transistor.

24. The integrated circuit according to claim 13, wherein the main MOS transistor is an NMOS transistor having a drain coupled to the input node, a source coupled to the reference node, and a gate coupled to the output node.

* * * * *